(12) United States Patent
Hwan et al.

(10) Patent No.: US 7,698,805 B2
(45) Date of Patent: Apr. 20, 2010

(54) METHOD FOR MANUFACTURING INTEGRATED CIRCUIT DEVICE HAVING ANTENNA CONDUCTORS

(75) Inventors: Lu-Chen Hwan, Taipei (TW); P. C. Chen, Zhubei (TW); Yu-Lin Ma, Zhongli (TW)

(73) Assignee: Mutual-Pak Technology Co., Ltd., Xinzhuang (TW)

( * ) Notice: Subject to any disclaimer, the term of this patent is extended or adjusted under 35 U.S.C. 154(b) by 159 days.

(21) Appl. No.: 12/026,309

(22) Filed: Feb. 5, 2008

(65) Prior Publication Data

US 2008/0184550 A1 Aug. 7, 2008

(30) Foreign Application Priority Data

Feb. 6, 2007 (TW) ............................. 96104237 A

(51) Int. Cl.
*H01Q 17/00* (2006.01)

(52) U.S. Cl. ............................. 29/601; 29/600; 29/841; 29/854; 343/700 MS; 343/895

(58) Field of Classification Search .................. 29/600, 29/601, 841, 842, 854; 343/720, 700 MS, 343/895; 455/334, 344
See application file for complete search history.

(56) References Cited

U.S. PATENT DOCUMENTS

| 6,552,694 | B1 * | 4/2003 | Fujii et al. .................. 343/895 |
| 2003/0116790 | A1 * | 6/2003 | Kikuchi et al. .............. 257/208 |
| 2006/0027936 | A1 | 2/2006 | Mizukoshi et al. |

* cited by examiner

*Primary Examiner*—Derris H Banks
*Assistant Examiner*—Jeffrey Carley
(74) *Attorney, Agent, or Firm*—Snell & Wilmer L.L.P.

(57) ABSTRACT

A method for manufacturing an integrated circuit device having antenna conductors is provided. The method includes the steps of providing a wafer with a plurality of integrated circuit components; forming a first antenna conductor on the surface of each integrated circuit component; forming a plurality of metal bumps above the first antenna conductor; coating an insulating layer to encapsulate the plurality of integrated circuit components and to cover the plurality of metal bumps; removing a portion of the insulating layer to expose a top portion of each metal bump; and forming a second antenna conductor on the insulating layer by screen printing.

14 Claims, 9 Drawing Sheets

US 7,698,805 B2

METHOD FOR MANUFACTURING INTEGRATED CIRCUIT DEVICE HAVING ANTENNA CONDUCTORS

CROSS REFERENCE TO RELATED APPLICATIONS

This application claims the right of priority based on Taiwan Patent Application No. 096104237 entitled "INTEGRATED CIRCUIT DEVICE HAVING ANTENNA CONDUCTORS AND THE METHOD FOR THE SAME", filed on Feb. 6, 2007, which is incorporated herein by reference and assigned to the assignee herein.

TECHNICAL FIELD

The present invention relates to methods for manufacturing an integrated circuit device, and more particularly, to methods for manufacturing an integrated circuit device having antenna conductors.

BACKGROUND OF THE INVENTION

FIG. 1A illustrates a schematic view of a conventional electronic device 10 with an antenna conductor. The electronic device 10 includes a circuit board 11, an antenna conductor 12, and an integrated circuit chip 13. The antenna conductor 12 and the integrated circuit chip 13 are directly disposed on the circuit board 111 and connected with each other through wires 14. FIG. 1B illustrates another conventional electronic device 10', which is similar to the electronic device 10 of FIG. 1. The electronic device 10' also has an antenna conductor 12 directly disposed on the circuit board 11, but has an integrated circuit chip 15 connected to the antenna conductor 12 by bumps 16 in a flip-chip manner. The integrated circuit chip 13 or 15 usually is a packaged chip. That is, in conventional methods, the antenna conductor 12 is firstly formed on the circuit board 11, and then, the integrated circuit chip 13 or 15 is surface-mounted to the circuit board 11 one-by one and connected to the antenna conductor 12. One drawback of conventional methods is that the arrangement of the antenna conductor 12 on the circuit board 11 requires a larger space, limiting the feasibility of scaling down the product size. Furthermore, the process of mounting and connecting the integrated circuit chip 13 or 15 to the antenna conductor 12 one by one causes the back-end of line packaging process highly complicated.

Besides the electronic device 10 or 10', another electronic device 20 is developed to reduce the required space, as shown in FIG. 2. The electronic device 20 has an antenna conductor 22 directly formed on the surface of the integrated circuit chip 23 by semiconductor thin film technique. The electronic device 20 is then packaged by a conventional semiconductor process, which induces higher production cost. Moreover, compared with the circuit board 11, the surface area of integrated circuit chip 23 is relatively small, and accordingly, the antenna 22 formed on the integrated circuit chip 23 is only suitable for short distance communication. If the electronic device 20 intends to be used for a longer distance communication application, a conventional method is to mount the electronic device 20 on a circuit board with additional antenna conductors in a manner as illustrated in FIG. 1A or FIG. 1B. That is, additional antenna conductors are firstly formed on the circuit board 11, and the electronic device 20 is then mounted and connected to the additional antenna conductors one by one. Consequently, the drawbacks of the conventional methods are inevitable when a longer distance communication application is concerned.

Therefore, it is desired to provide an inventive method to address the issues caused by the conventional methods.

SUMMARY OF THE INVENTION

One aspect of the present invention is to provide a method for manufacturing an integrated circuit device having antenna conductors in wafer-level package. The term "wafer-level package" indicates that multiple dies on a single wafer are packaged simultaneously, and then divided into multiple individual packaged chips. The method for manufacturing an integrated circuit device having antenna conductors is accomplished by integrating the screen-printing technique into the wafer-level package process, which increases the productivity compared with the conventional method.

The present invention utilizes the screen-printing technique to form metal bumps or antenna conductors on the surface of each integrated circuit component so as to simplify the manufacturing process and reduce the production cost.

Moreover, in another aspect of the present invention, the method for manufacturing an integrated circuit device provides a multi-layer antenna structure so that the length of the antenna is not limited to the surface area of a single layer.

In one embodiment, the present invention provides a method for manufacturing an integrated circuit device having antenna conductors. The method includes providing a wafer with a plurality of integrated circuit components; forming a first antenna conductor on the surface of each integrated circuit component; forming a plurality of metal bumps above the first antenna conductor by screen-printing; coating an insulating layer to encapsulate the plurality of integrated circuit components and to cover the plurality of metal bumps; removing a portion of the insulating layer to expose a top portion of each metal bump; and forming a second antenna conductor on the insulating layer by screen printing.

In another embodiment, the present invention provides a method for manufacturing an integrated circuit device having antenna conductors. The method includes providing a wafer with a plurality of integrated circuit components, each integrated circuit component on its surface including a dielectric layer and a first electrode embedded in the dielectric layer; forming an antenna conductor having a first end and a second end on the surface; forming a plurality of metal bumps respectively positioned on the first end and the second end by screen-printing; coating an insulating layer to encapsulate the plurality of integrated circuit components and to cover the plurality of metal bumps; and removing a portion of the insulating layer to expose a top portion of each metal bump.

BRIEF DESCRIPTION OF THE DRAWINGS

The present invention will now be described, by way of examples, with reference to the accompanying drawings, in which:

FIG. 3A to FIG. 9A illustrate schematic top views of a method for manufacturing an integrated circuit device having antenna conductors in accordance with one embodiment of the present invention; and FIG. 3B to FIG. 9B illustrate schematic cross-sectional views of a method for manufacturing an integrated circuit device having antenna conductors in accordance with one embodiment of the present invention.

DETAILED DESCRIPTION OF THE PREFERRED EMBODIMENTS

Figure 1A:
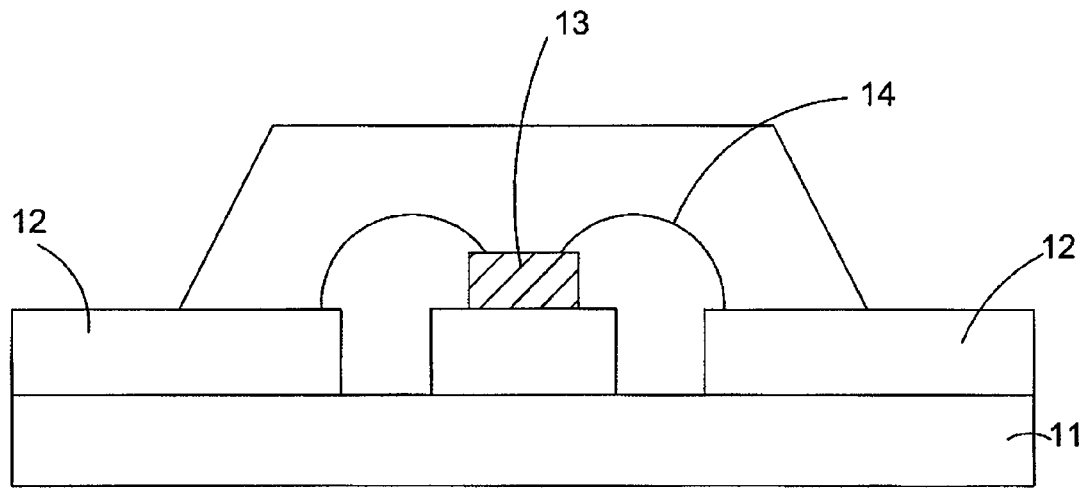
FIGS. 1A, 1B, and 2 illustrate schematic views of a conventional electronic device with antenna conductors.
Figure 1B:
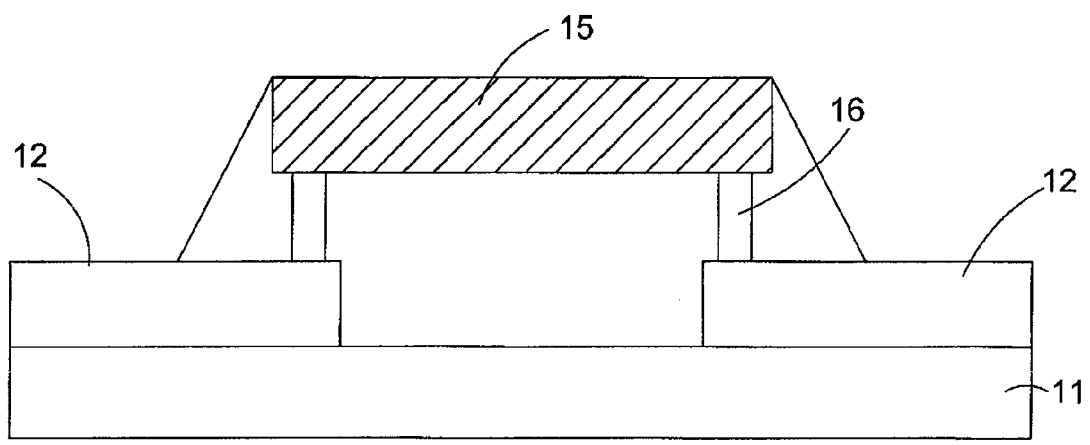
Figure 2:
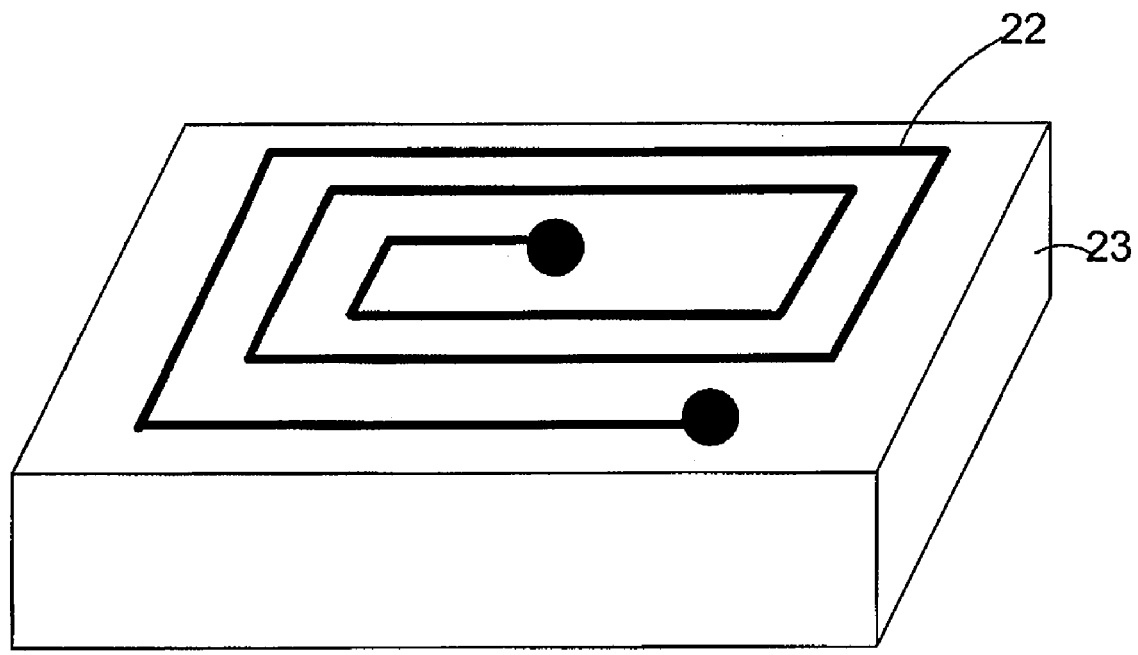

The preferred embodiments of the present invention will now be described in greater details by referring to the drawings that accompany the present application. It should be noted that the features illustrated in the drawings are not necessarily drawn to scale. Descriptions of well-known components, materials, and process techniques are omitted so as not to unnecessarily obscure the embodiments of the invention.

Figure 3A:
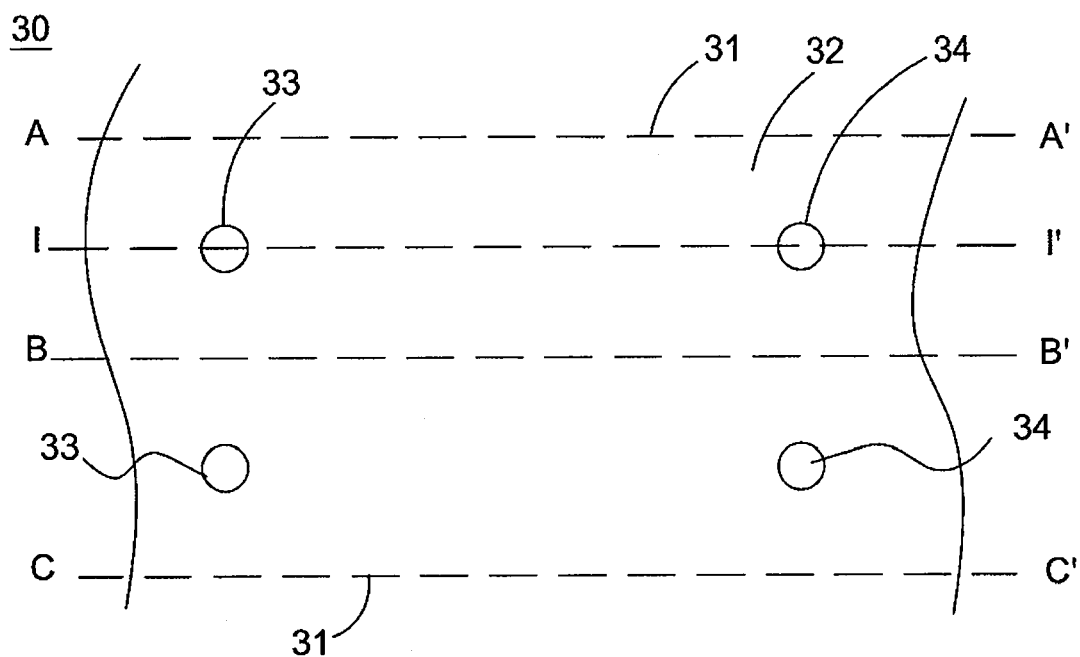
Figure 3B:
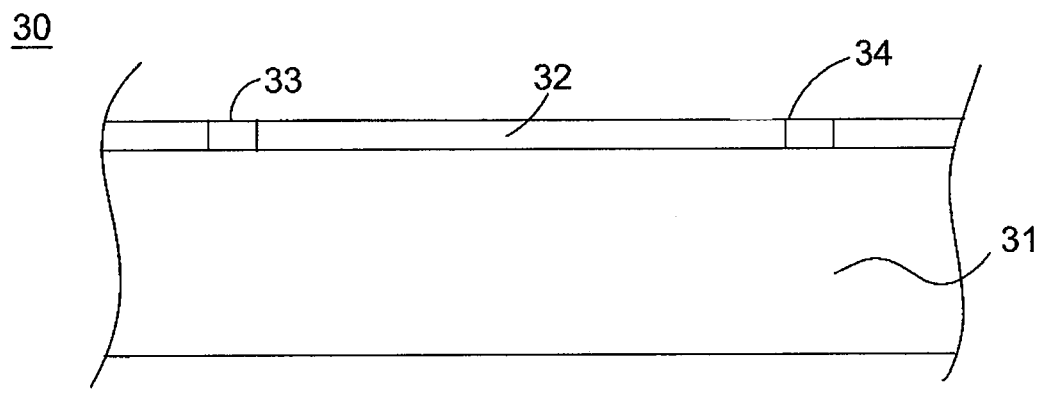

FIGS. 3A and 3B to FIGS. 9A and 9B schematically illustrate one embodiment of the present invention. FIG. 3A is a top view of a wafer 30. FIG. 3B is a cross-sectional view of the wafer 30 along a dotted line I-I' of FIG. 3A. Likewise, FIG. 4A to FIG. 9A are top views of the wafer 30 at various processing stages, and FIG. 4B to FIG. 9B are cross-sectional views of the wafer 30 along the dotted line I-I' at the various stages corresponding to FIG. 4A to FIG. 9A.

The wafer 30 provided in this embodiment is formed with a plurality of integrated circuit components 31. For example, two integrated circuit components 31 are illustrated in FIG. 3A, wherein one integrated circuit component is between the dotted lines A-A' and B-B', and the other one is between the dotted lines B-B' and C-C'. The integrated circuited components 31 may be any suitable electronic component, such as Radio Frequency Integrated Circuits (RFIC), any types of Metal-Oxide-Semiconductor Field-Effect Transistor (MOSFET) or Light Emitting Diodes (LED), etc. The integrated circuit component 31 is formed with a dielectric layer 32 on its surface. A first electrode 33 and a second electrode 34 configured to be coupled with antenna conductors to be later formed are embedded in the dielectric layer 32. The structure of FIG. 3A can be formed during the semiconductor process for the integrated circuit component 31.

Figure 4A:
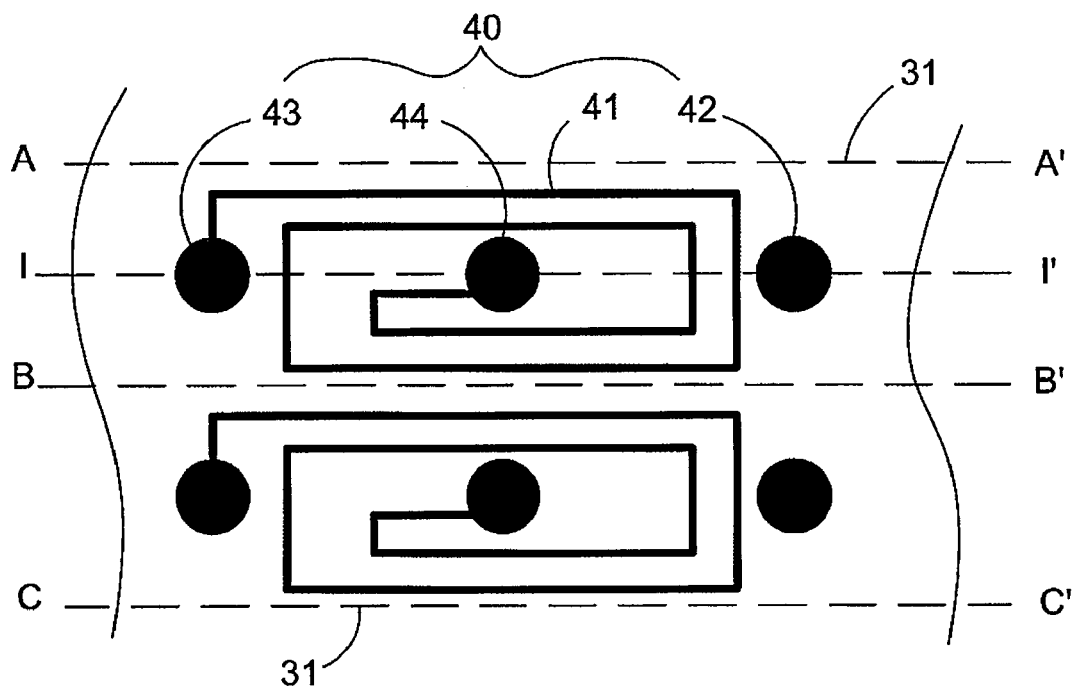
Figure 4B:
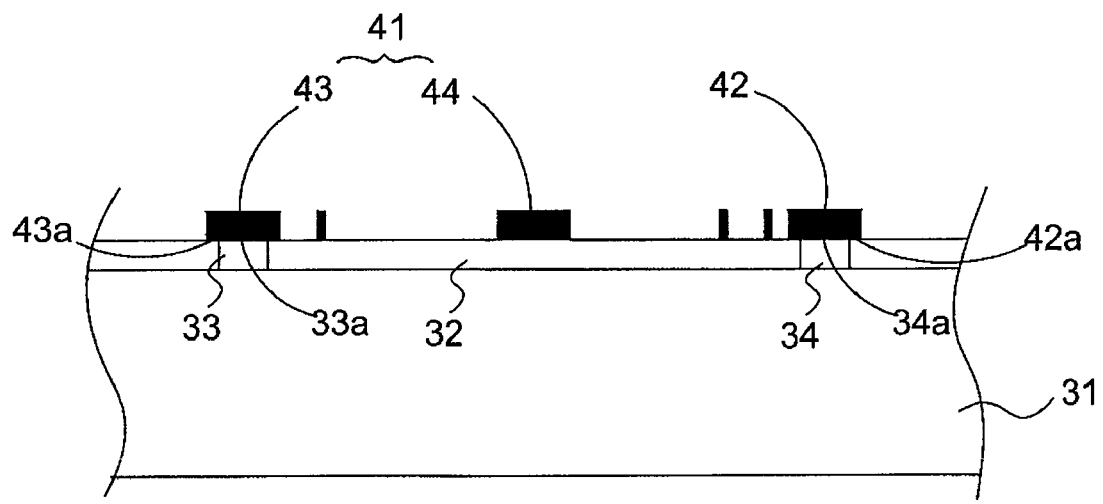

Referring to FIG. 4A and FIG. 4B, a first patterned conductive layer 40 is formed on the surface of the integrated circuit component 31. The first patterned conductive layer 40 includes a first antenna conductor 41 and a first conductive joint 42. The first antenna conductor 41 is formed with two ends 43 and 44. One of the two ends, such as the first end 43, is connected to the first electrode 33, and the first antenna conductor 41 is formed as a loop around the other end, such as the second end 44. The second end 44 is located between the first end 43 and the first conductive joint 42. The first conductive joint 42 is configured to electrically connect subsequent conductive layers to be formed. The first patterned conductive layer 40 can be made by printing, which will be described as below. Please note that if much finer lines or more numbers of the loops are required, the first patterned conductive layer 40 can be formed by thin film plating processes. As shown in FIG. 4B, the cross-sectional area of the first end 43 of the first antenna conductor 41 is preferably larger than the cross-sectional area of the first electrode 33. Similarly, the cross-sectional area of the first conductive joint 42 is preferably larger than the cross-sectional area of the second electrode 34. In other words, the bottom surface 43a of the first end 43 is preferably larger than the top surface 33a of the first electrode 33. Similarly, the bottom surface 42a of the first conductive joint 42 is preferably larger than the top surface 34a of the second electrode 34. Such a structure is designed for expanding the electrical contact surface so as to facilitate the printing process to be preformed in the following steps.

Figure 5A:
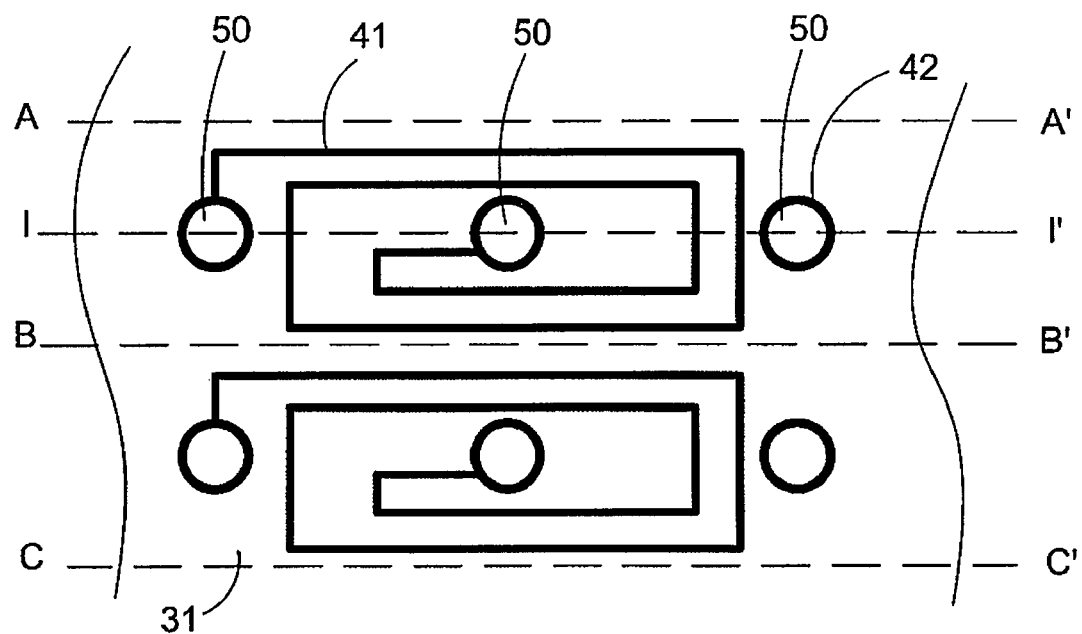
Figure 5B:
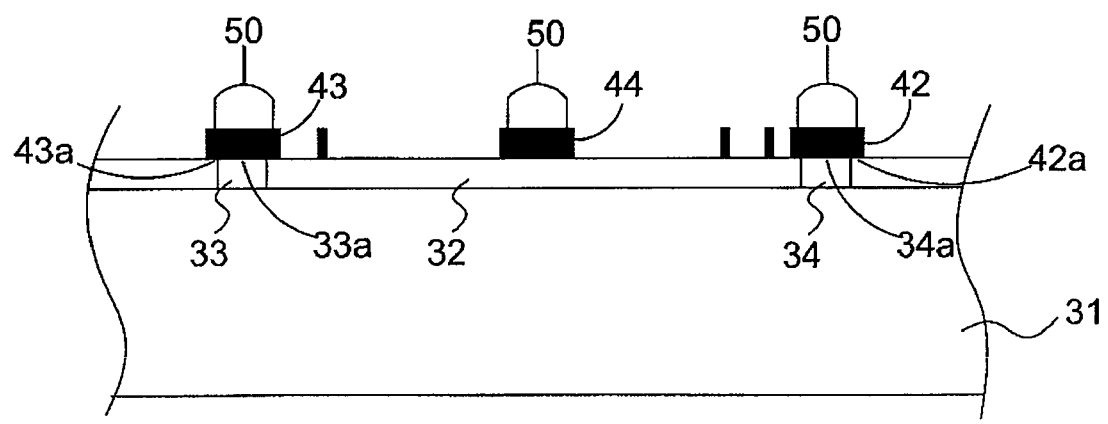

Referring to FIG. 5A and FIG. 5B, a plurality of metal bumps 50 are formed on the two ends 43 and 44 of the first antenna conductor 41 and the first conductive joint 42 by screen-printing. The screen-printing is referred as a method using a conventional printing machine with a patterned meshed screen as a mask. By pressing conductive materials through openings on the meshed screen, the plurality of metal bumps 50 are formed on the surfaces of the integrated circuit components 31. For example, the conductive materials can be a metal material, such as Cu, Ag, or Sn, a non-metal material, such as conductive polymer, or the combination thereof. The conductive material also can include polymer adhesives, such as epoxy resins. After printing the first patterned conductive layer 40, the structure can be subjected to a high temperature so as to enhance the conductivity. Preferably, the thickness of the metal bumps 50 is larger than the thickness of the first patterned conductive layer 40. The preferred range of the thickness of the metal bumps 50 is between 20 μm and 70 μm.

Figure 6A:
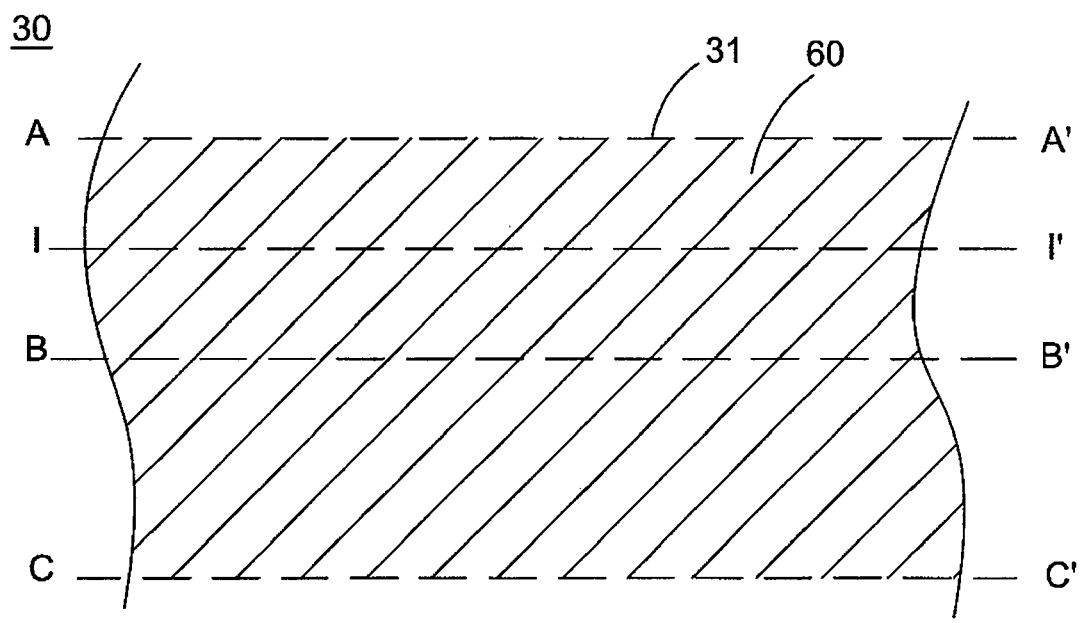
Figure 6B:
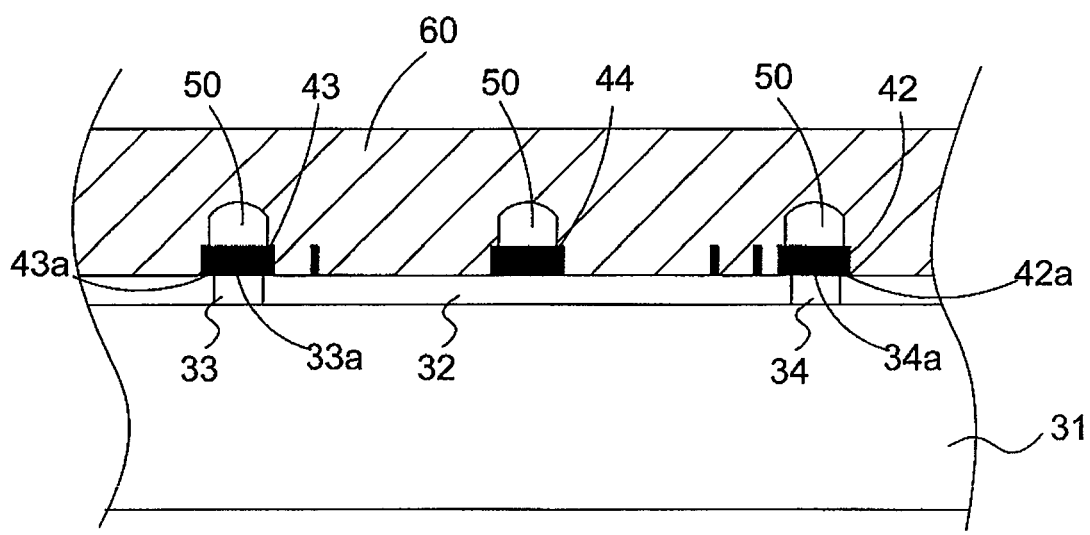

Referring to FIG. 6A and FIG. 6B, an insulating layer 60 is uniformly coated on the wafer 30 to encapsulate all the integrated circuit components 31. Specifically, the insulating layer 60 covers the dielectric layer 32, the first patterned conductive layer 40, and the metal bumps 50. The material for the insulating layer 60 is preferably polymers in liquid type, such as epoxy, polyimide, benzocycle butane, liquid crystal polymers, etc. The preferred thickness of the insulating layer 60 is between 50 μm and 200 μm. After forming the insulating layer 60, a thermal process can be optionally preformed in order to solidify the insulating layer 60.

Figure 7A:
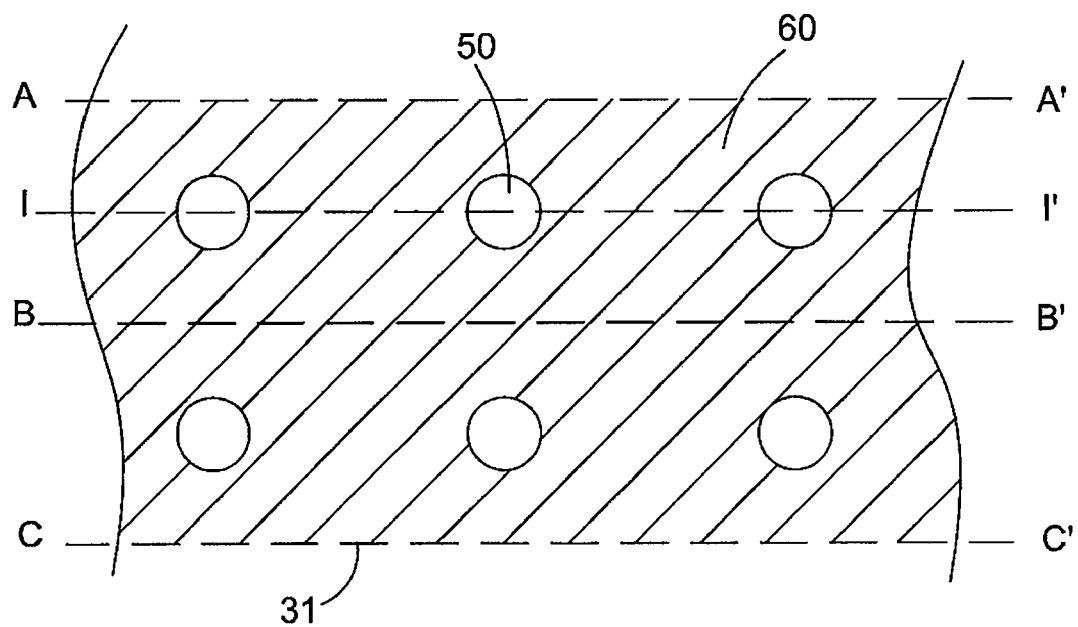
Figure 7B:
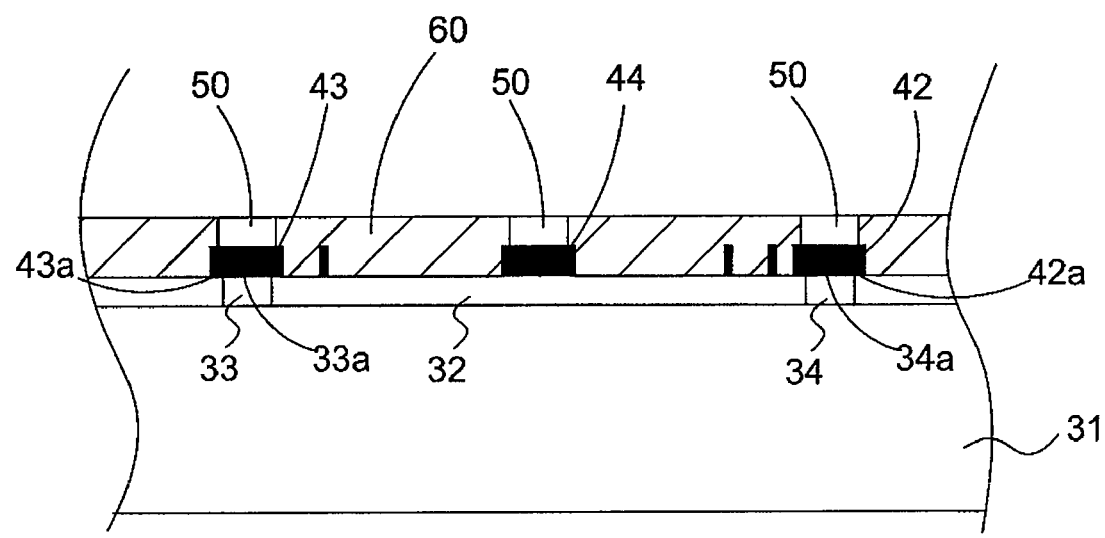

Referring to FIG. 7A and FIG. 7B, the insulating layer 60 is polished to expose top surfaces of the metal bumps 50. That is, a portion of the insulating layer 60 and an optional portion of the metal bumps 50 are removed. The polishing step is preformed to planarize the whole structure and to expose the top surface of each metal bump 50. During polishing, the wafer 30 can be fixed on a base, so that the insulating layer 60 and the metal bumps 50 can be removed by using polishing plate heads and slurries.

Figure 8A:
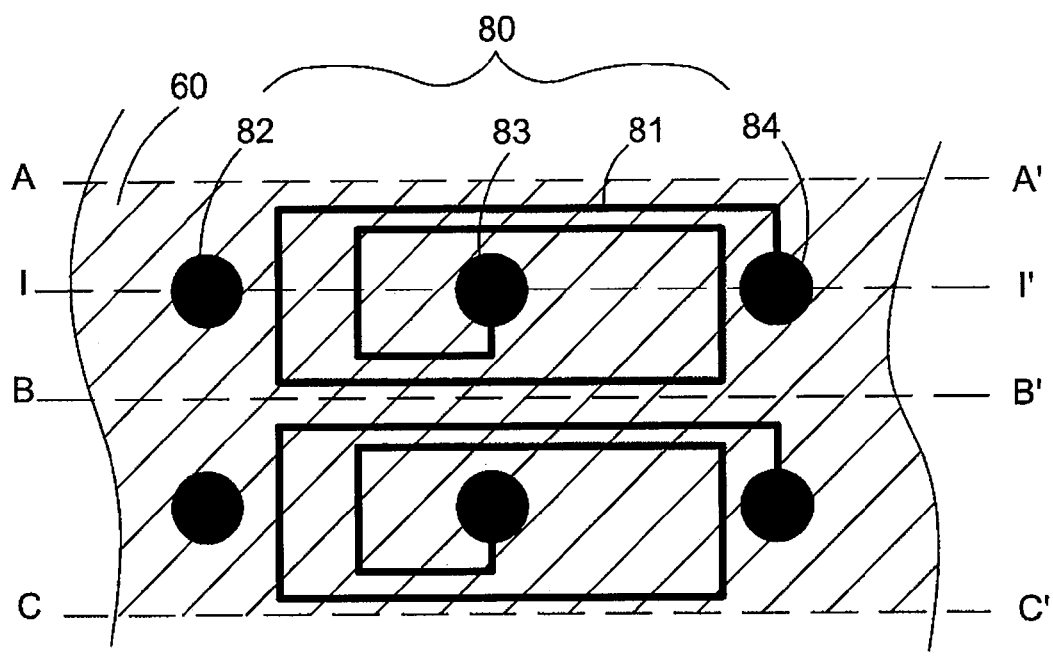
Figure 8B:
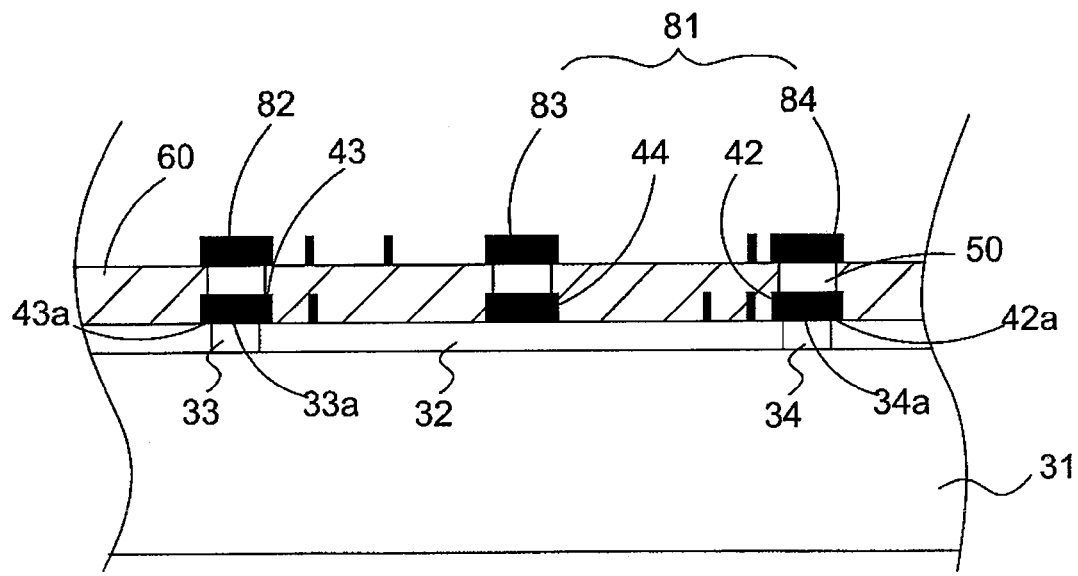

After the polishing step, a second patterned conductive layer 80 is formed on the insulating layer 60 of each integrated circuit component 31, as shown in FIG. 8A and FIG. 8B. The material for the second patterned conductive layer 80 can be similar to the aforementioned metal bumps 50, but not limited thereto. Note that the second patterned conductive layer 80 is structurally different from the first patterned conductive layer 40. For example, the second patterned conductive layer 80 includes a second antenna conductor 81 and a second conductive joint 82. The second antenna conductor 81 is formed with two ends 83 and 84. The third end 84 is positioned corresponding to the second electrode 34 and coupled with the second electrode 34 through the metal bump 50. The second antenna conductor 81 is formed as a loop around the fourth end 83. The fourth end 83 is between the third end 84 and the second conductive joint 82. Note that the fourth end 83 is positioned corresponding to the second end 44 of the first antenna conductor 41 and coupled with the second end 44 through the metal bump 50. In addition, it should be noted that the second conductive joint 82 is positioned corresponding to the first electrode 33 and coupled with the first end 43 of the first antenna conductor 41 through the metal bump 50.

Figure 9A:
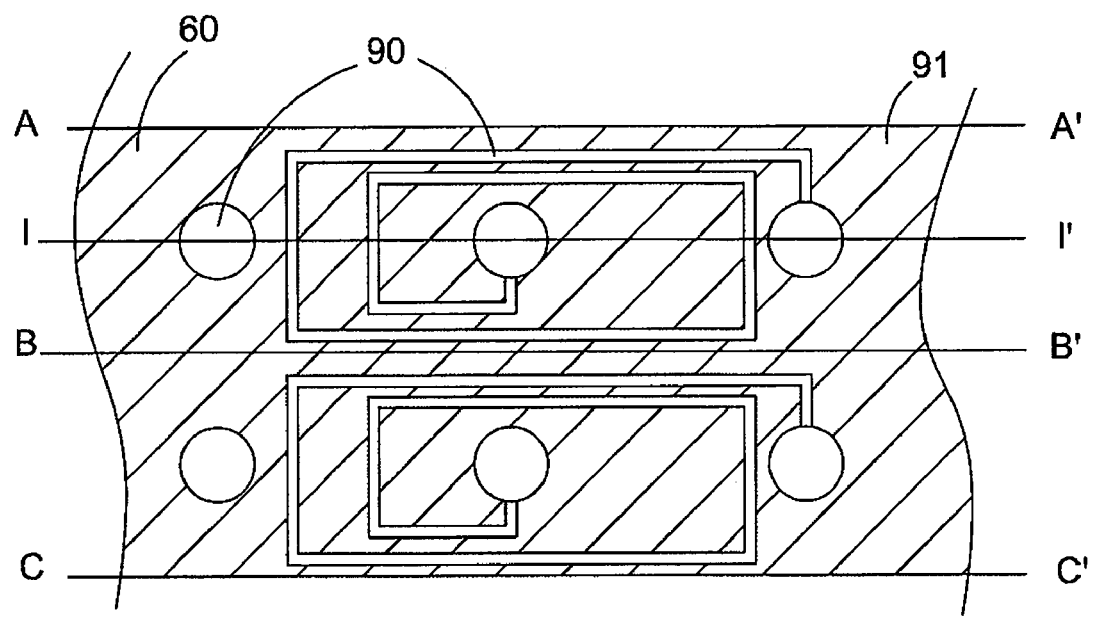
Figure 9B:
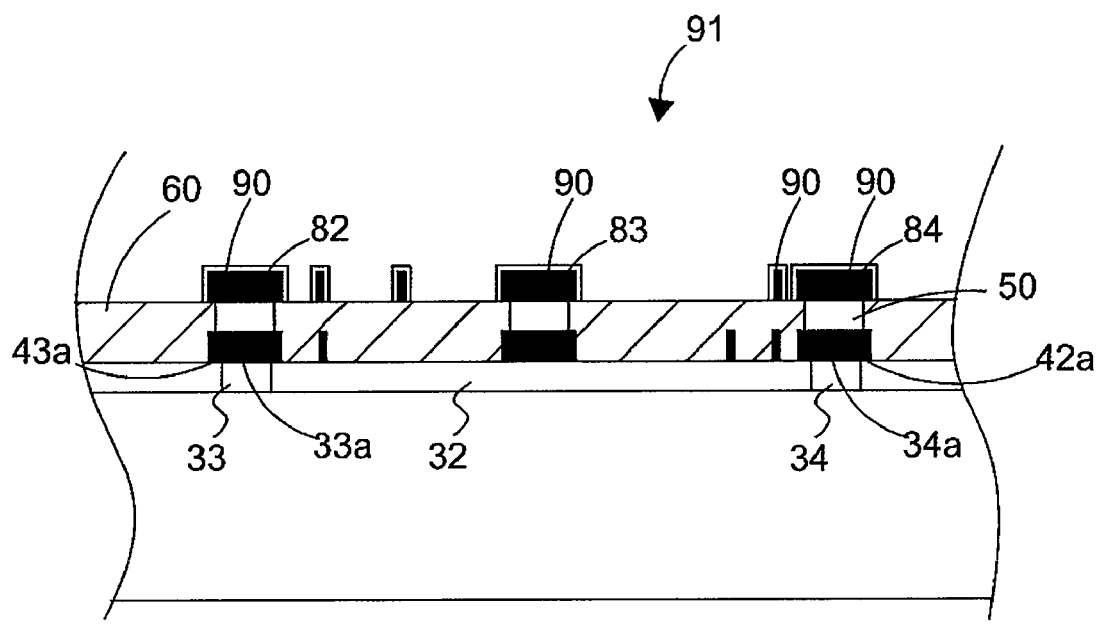

As shown in FIG. 9A and FIG. 9B, an optional step of plating a protective layer 90 on the surface of the second patterned conductive layer 80 may be performed. The material for the protective layer 90 can be Au or Ni. Furthermore, a solder resist (not shown) can be optionally coated on the second patterned conductive layer 80. Then, following a step of wafer backside grinding, the wafer 30 is cut along the dotted lines A-A', B-B' and C-C' to form a plurality of integrated circuit chips. Each integrated circuit chip is encapsulated and is separated from each other.

Although a two-layer antenna structure (i.e. the first antenna conductors and the second antenna conductors) formed in a wafer-level package is illustrated in the above embodiments, the ordinary people skilled in the art will appreciate that the present invention may be implemented with one or more layers. Based on the above description, it should be understood that the present invention also includes an integrated circuit device having antenna conductors, which is formed in the wafer-level package. In other words, the present invention includes the step of forming a first level of antenna conductor on the surface of the plurality of integrated circuit components. The wafer is encapsulated after forming the first level of antenna conductor, the metal bumps or the second level of antenna conductor thereon by screen-printing. After an antenna conductor with desired number of levels is formed and the integrated circuit chip is encapsulated, the wafer is cut to form multiple and distinct integrated circuit chips. Accordingly, compared with the prior art, the present invention using the screen-printing technique significantly reduces the manufacturing cost. The present invention also provides an integrated circuit device with multiple levels of antenna. In addition, the present invention further provides methods of integrating the antenna conductors into the wafer level encapsulation process. Therefore, compared with the prior art, the process of the present invention is relatively simple. The present invention benefits the electronic products with less short circuits as well as lower cost in the stage of surface mounting technology (SMT).

The detailed description of the above preferable embodiments is to describe the technical features and spirit of the present invention, and the disclosed preferable embodiments are not intended to limit the scope of the present invention. On the contrary, the preferable embodiments and its variations and equivalents thereof all fall within the scope of the present invention. Therefore, the scope of the present invention should be most broadly explained according to the foregoing description and includes all possible variations and equivalents.

We claim:

1. A method for manufacturing an integrated circuit device having antenna conductors, the method comprising the steps of:
    providing a wafer with a plurality of integrated circuit components;
    forming a first antenna conductor on a surface of each integrated circuit component;
    forming a plurality of metal bumps above the first antenna conductor by screen-printing;
    coating an insulating layer to encapsulate the plurality of integrated circuit components and to cover the plurality of metal bumps;
    removing a portion of the insulating layer to expose a top portion of each metal bump;
    and forming a second antenna conductor on the insulating layer by screen printing.

2. The method according to claim 1, wherein the first antenna conductor has a first end and a second end connected to a first electrode and a second electrode of the integrated circuit device respectively, and the first antenna conductor is formed as a loop around the second end.

3. The method according to claim 2, wherein the first end is formed with a bottom surface larger than an upper surface of the first electrode.

4. The method according to claim 2, further comprising forming a first conductive joint on the surface of each integrated circuit component by screen-printing, wherein the first conductive joint is connected to the second electrode.

5. The method according to claim 4, wherein the first conductive joint is formed with a bottom surface larger than an upper surface of the second electrode.

6. The method according to claim 4, wherein the second end is positioned between the first conductive joint and the first end.

7. The method according to claim 4, wherein the plurality of metal bumps are positioned on the first end, the second end, and the first conductive joint.

8. The method according to claim 4, wherein the second antenna conductor has a third end corresponding to the second electrode, and the third end is connected to the first conductive joint through one of the plurality of metal bumps.

9. The method according to claim 4, wherein the second antenna conductor has a fourth end corresponding to the second end, and the fourth end is connected to the second end through one of the plurality of metal bumps.

10. The method according to claim 2, further comprising forming a second conductive joint corresponding to the first electrode by screen-printing, wherein the second conductive joint is electrically connected to the first end through one of the plurality of metal bumps.

11. The method according to claim 9, wherein the second antenna conductor is formed as a loop around the fourth end.

12. The method according to claim 1, further comprising cutting the wafer to form a plurality of integrated circuit chips, wherein each integrated circuit chip is packaged and is separated from each other.

13. The method according to claim 1, further comprising forming a protective layer on a surface of the second antenna conductor.

14. The method according to claim 13, wherein the protective layer is made by a material selected from the group consisting of Ni, Au, and the combination thereof.

* * * * *